United States Patent
Witvoet et al.

(10) Patent No.: US 9,880,194 B2
(45) Date of Patent: Jan. 30, 2018

(54) ACTUATOR MODULE FOR ACTUATING A LOAD

(71) Applicant: Nederlandse Organisatie voor toegepast-natuurwetenschappelijk onderzoek TNO, 's-Gravenhage (NL)

(72) Inventors: Gerrit Witvoet, 's-Gravenhage (NL); Teunis Cornelis van den Dool, 's-Gravenhage (NL); William Edward Crowcombe, 's-Gravenhage (NL); Theodorus Jacobus de Lange, 's-Gravenhage (NL); Hajo Pieter Pereboom, 's-Gravenhage (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 15/301,454

(22) PCT Filed: Mar. 31, 2015

(86) PCT No.: PCT/NL2015/050206
§ 371 (c)(1),
(2) Date: Oct. 3, 2016

(87) PCT Pub. No.: WO2015/152716
PCT Pub. Date: Oct. 8, 2015

(65) Prior Publication Data
US 2017/0108531 A1    Apr. 20, 2017

(30) Foreign Application Priority Data
Apr. 4, 2014  (EP) .................................... 14163625

(51) Int. Cl.
*G01Q 10/04*        (2010.01)
*G01Q 30/04*        (2010.01)
(Continued)

(52) U.S. Cl.
CPC ............. *G01Q 10/04* (2013.01); *G01Q 30/04* (2013.01); *G06F 17/11* (2013.01); *G06F 17/5009* (2013.01)

(58) Field of Classification Search
CPC ........ G01Q 10/04; G01Q 60/24; G01Q 70/02; G01Q 70/06; G01Q 70/16; H01L 41/053; H02N 2/02; H02N 2/04
See application file for complete search history.

(56) References Cited

U.S. PATENT DOCUMENTS

| | | | | |
|---|---|---|---|---|
| 7,117,724 B1* | 10/2006 | Goodberlet | ............ | B82Y 35/00 73/105 |
| 2010/0060107 A1* | 3/2010 | Seki | ....................... | H02N 2/004 310/323.16 |
| 2013/0336644 A1* | 12/2013 | Schultz | .................... | G03B 5/00 396/428 |

FOREIGN PATENT DOCUMENTS

| | | |
|---|---|---|
| EP | 0643427 | 3/1995 |
| EP | 0741421 | 11/1996 |
| EP | 2242123 | 10/2010 |

* cited by examiner

*Primary Examiner* — Wyatt Stoffa
*Assistant Examiner* — Eliza Osenbaugh-Stewart
(74) *Attorney, Agent, or Firm* — Banner & Witcoff, Ltd.

(57) ABSTRACT

The disclosure concerns an actuator module (10) for actuating a load (14). The actuator module (10) comprises a deformable frame (1) and an actuator (2) connected to the deformable frame (1). A time-varying force distribution (F) couples to an excited state (V0) of an eigenmode (V) of the deformable frame (1). The force distribution (F), as well as a stiffness distribution (K) and/or mass distribution (M) of the deformable frame 1 are adapted such that static nodal points (11s) of the deformable frame 1 are coincided with mode nodal points (11m). The locations where the nodal points coincide can be used to connect the actuator module (10) to a base frame to reduce transfer of vibrations to the (Continued)

base frame and back which may otherwise undesirably influence the transfer function from actuator to load. The disclosure further concerns a method for designing and/or manufacturing the actuator module.

14 Claims, 10 Drawing Sheets

(51) Int. Cl.
    *G06F 17/11*     (2006.01)
    *G06F 17/50*     (2006.01)

ACTUATOR MODULE FOR ACTUATING A LOAD

TECHNICAL FIELD AND BACKGROUND

The present disclosure relates to an actuator module, actuator system comprising the actuator module, e.g. for use in an atomic force microscopy (AFM) system. The disclosure further relates to a computer-implemented method for designing an actuator module, a computer-readable storage medium, and a method for manufacturing an actuator module.

An actuator module can be used to actuate a load, e.g. cause a vibrational motion of the load. For example in an atomic force microscope, an actuator module can be used as a scan head that actuates a probe tip for scanning a specimen surface.

In general, it is desired that the dynamic transfer function or frequency response function between an applied actuator force (input) and a displacement of an actuating surface or probe (output) be as smooth as possible, e.g. free of disturbing resonances. However, when the actuator module is connected to a base frame in a conventional way, movements of the actuator module may excite base frame vibrations. These induced vibrations may influence the transfer or response function and deteriorate performance of the actuator system.

Accordingly, it is desired to provide an actuator module connectable to a base frame wherein a transfer of vibrations from the actuator module to the base frame is reduced.

SUMMARY

A first aspect of the present disclosure provides an actuator module for actuating a load. The actuator module comprises a deformable frame and an actuator connected to the deformable frame. The deformable frame has a stiffness distribution and mass distribution determining vibrational eigenmodes of the deformable frame. An interface of the deformable frame comprises a plurality of mode nodal points defined as points that are stationary during modal deformation of the deformable frame in an excited state of one of the eigenmodes. The actuator is connected to the deformable frame and arranged for exerting a time-varying force distribution onto the deformable frame via a connection between the deformable frame and the actuator. The interface of the deformable frame comprises a plurality of static nodal points defined as points that are stationary during static deformation of the deformable frame when the force distribution exerted by the actuator is applied under static or quasi-static conditions. The time-varying force distribution, in use, couples to the excited state of the eigenmode. The deformable frame comprises an actuation surface, in use, oscillating due to the combined modal and static deformations of the deformable frame for actuating the load contacting and/or connected to said actuation surface. The force distribution, stiffness distribution, and mass distribution are adapted to have the static nodal points coincide with the mode nodal points or at least be as close together as feasible.

Without being bound by theory, the invention is based on the following insights. On the one hand, a deformable frame has vibrational eigenmodes depending on a stiffness distribution and mass distribution of the deformable frame. When a time-varying force distribution is arranged to couple to an excited state of one of the eigenmodes, e.g. near the associated eigenfrequency and along a similar direction of deformation as the eigenmode, the deformable frame can start to resonate in the said eigenmode. This is referred to as the modal deformation of the frame and may be regarded as the deformation that could take place even if the external force is removed. During (pure) modal deformation, i.e. absent actuator force, it can be observed that certain points of the frame, referred to as 'mode nodal points' (e.g. points on a respective nodal line through the frame), remain stationary during the eigenmode vibration. In other words, these mode nodal points do not displace with respect to a centre of mass of the deformable frame under the influence of modal deformation. On the other hand, by exerting a force onto the deformable frame, the frame deforms depending on a stiffness distribution of the frame and a distribution of the force onto the frame. When the force is applied under static or quasi-static conditions, this is referred to as the 'static deformation' of the frame. It can be observed that certain points of the frame, referred here as the 'static nodal points', remain stationary when a magnitude of the static force is varied slowly. In other words, these static nodal points do not displace with respect to a centre of mass of the deformable frame during quasi-static variation of the exerted force. Static or quasi static conditions are e.g. obtained at frequencies well below the lowest eigenfrequency of the frame, i.e. when the influence of modal deformation can be neglected. For example, static nodal points can be observed as those points that remain in the same place when a static force is applied compared to when no force is applied.

It will be appreciated that because nodal points exhibit minimal or no displacement, they provide an advantageous location for connecting the actuator module to the base frame. Since there will be minimal or no relative translation at these points, vibrational transfer via said point can be minimal. However, in an actuator module without optimization, a position of the nodal points may vary depending on a frequency of the actuating force. Accordingly, a connection to a specific point of the frame that is stationary at one frequency, may not be stationary at another frequency. This behaviour is found to be caused by the fact that in a conventional actuator module, the mode nodal points and static nodal points do not coincide. Therefore, in a conventional actuator module a position of the effective nodal points (i.e. points that remain stationary) can depend on the relative contributions of the static and modal deformations which contributions in turn may depend on the frequency of the actuator force.

It is presently recognized that by adapting the actuator module such that the static nodal points coincide with the mode nodal points, a frequency dependence of a position of the nodal points is reduced. For example, a position of the static nodal points can be adapted by a choice of the force distribution of the actuator on the frame and/or the stiffness distribution of the frame. Furthermore, a position of the mode nodal points can be adapted by a choice of the mass distribution of the frame and/or the stiffness distribution of the frame. Accordingly, one or more of the force distribution, stiffness distribution, and mass distribution can be adapted to have the static nodal points coincide with the mode nodal points. Finally, by connecting a base frame to the actuator module at the positions of the coinciding nodal points, a transfer of vibrations from the actuator module to the base frame is reduced. In particular, a frequency dependence of the transfer is reduced resulting in a more smooth dynamic transfer function or frequency response function.

To provide a good result it is found preferable that the static nodal points coincide with the mode nodal points as close together as possible, e.g. within a tolerance or distance of less than one percent of a size dimension (e.g. length or width or largest cross-section diameter) of the interface or surface of the deformable frame where the connectors to the base frame are to be applied, preferably even closer, e.g. less than half a percent, more preferably less than a tenth of a percent, most preferably fully coinciding at least within a measurable margin of error. The closer together the two types of nodal points, the better can be the reduction of vibrational transfer. In case there is any small distance it is found most preferable to place the connectors centred at the respective static nodal points with the corresponding mode nodal points nearby (e.g. within one percent of the frame size)

By providing the deformable frame with a plurality of frame connectors, the actuator module can be more easily connected to a base frame. By arranging the frame connectors at the interface of the deformable frame centred on the coinciding nodal points, vibrations in the module caused by the actuator may have minimal influence on the frame connectors, e.g. the forces on the frame connectors as a result of the combined static and modal transformations may be minimal. For example, a frame connector comprises a respective recess and/or protrusion centred on the coinciding nodal points. In this way the position of the nodal points can be easily identified and the deformable frame can be held via the recess and/or protrusion, e.g. by a corresponding structure on the base frame that mates with the respective recess and/or protrusion. By providing connections between the actuator module and base frame that are rotationally free around respective coinciding nodal points, twisting of the frame around said points that may occur during modal and/or static deformation is not passed to the base frame. By providing at least three connection points between the actuator module and base frame, the position may be advantageously determined.

As discussed above, during modal deformation, some parts of the deformable frame may remain stationary, i.e. the mode nodal points. On the contrary, other parts of the deformable frame between the mode nodal points, may exhibit maximal modal deformation. These are referred to as mode anti-nodes. It is found that by centring the connection between the actuator and deformable frame on a mode anti-node of the deformable frame, the static nodal points and mode nodal points can be more easily made to coincide. It will be appreciated that by exerting force where modal deformation is maximal a stronger coupling to the corresponding eigenmode may be established.

The deformable frame of the actuator module can have various shapes having suitable nodes. For example, it is found advantageous to provide an O-type frame, wherein the deformable frame comprises a closed loop surrounding the actuator. In this way the actuator can be placed inside the loop and exert opposite forces on either side of the loop. To improve symmetry, the deformable frame can also comprise two interconnected closed loops, i.e. an eight-type frame, wherein each loop surrounds a respective actuator.

By providing the deformable frame with a mirror symmetric structure, it can be easier to identify the nodal points. For example where one nodal point appears on one side of the mirror plane, another can be expected at the other side. By applying, an equal but opposite force distribution on either side of the mirror symmetric structure the force distributions may result in an equal but opposite deformation of the mirror symmetric structure. For example, the force can be exerted by placing one or more actuators in between the mirroring sides. Symmetry can also be improved by providing an even number of actuators, e.g. two, working in opposite directions. For example when the two actuators are mirror symmetric with respect to each other, the symmetry in the system can be improved. The actuators can apply the same but oppositely oriented force distributions on either side of the deformable frame. It will be appreciated that improving symmetry of the system, can provide further benefit with regards to minimizing vibrational transfer to a base frame. In particular, in a symmetrically vibrating deformable frame, some points can remain stationary around the centre of mass of the frame.

An actuator system may comprise a base frame holding an actuator module as described herein. By minimizing the contact area on the deformable frame, the coinciding nodal points can be better targeted. For example, when the actuator module is connected to the base frame via a plurality of pins the contact area can be minimal.

The actuator system may comprise a translation and/or rotation system between the base frame and a stationary base for controlled translation and/or rotation of the base frame with respect to the stationary base. It will be appreciated that because the actuator module transfers only minimal vibrations to the base frame, the requirements with regards to vibrational damping and stability of the rest of the system can be less stringent. For example, normal modes in the rest of the system are not excited by the actuator module and do not influence it vice versa. Since influence of the actuator module on the rest of the actuator system is minimized, the base frame can be connected to a plurality of actuator modules, while they only minimally influence each other.

It will be appreciated that the actuator module as described herein can provide benefit to systems that require good vibrational stability and control. For example, an atomic force microscopy system comprising a actuator module as described, can exhibit increased performance and predictability. The actuating surface can be arranged for actuating a probe tip for scanning a specimen surface in a controlled fashion with an as smooth as possible and predictable frequency response function.

A second aspect of the present disclosure provides a method for designing an actuator module. The method comprises simulating a deformable frame having a stiffness distribution and mass distribution. The method further comprises simulating exerting a force distribution onto the deformable frame under quasi-static conditions. The method further comprises calculating positions of static nodal points which are stationary during static deformation of the deformable frame under quasi-static conditions. The method further comprises calculating a vibrational eigenmode of the deformable frame that couples to the force distribution when a magnitude of the force distribution is time-oscillated. The method further comprises calculating positions of mode nodal points at an interface of the deformable frame which are stationary during modal deformation of the deformable frame in an excited state of the eigenmode. The method further comprises calculating a distance between the static nodal points and the mode nodal points and varying one or more of the force distribution, stiffness distribution, and/or mass distribution until the static nodal points coincide with the mode nodal points. These steps can e.g. be performed iteratively until a distance between the static nodal points and mode nodal points is minimized. For example, the method can be implemented on one or more computers. Typically, the method can be embodied as a non-transient computer-readable storage medium with program instructions that, when run on one or more computers, cause the one or more computers to perform the said method.

When a design of an actuator module is thus obtained wherein the force distribution, stiffness distribution, and mass distribution are adapted to have the static nodal points coincide with the mode nodal points, the actuator module can be manufactured accordingly. In one manufacturing method, a deformable frame is provided with the stiffness distribution and mass distribution according to the design. Furthermore, an actuator is connected to the deformable frame and arranged for exerting a time-varying force distribution onto the deformable frame via a connection between the deformable frame and the actuator. The force distribution is arranged according to the design, e.g. the force distribution at least under quasi-static conditions conforms with the force distribution according to the design.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1:
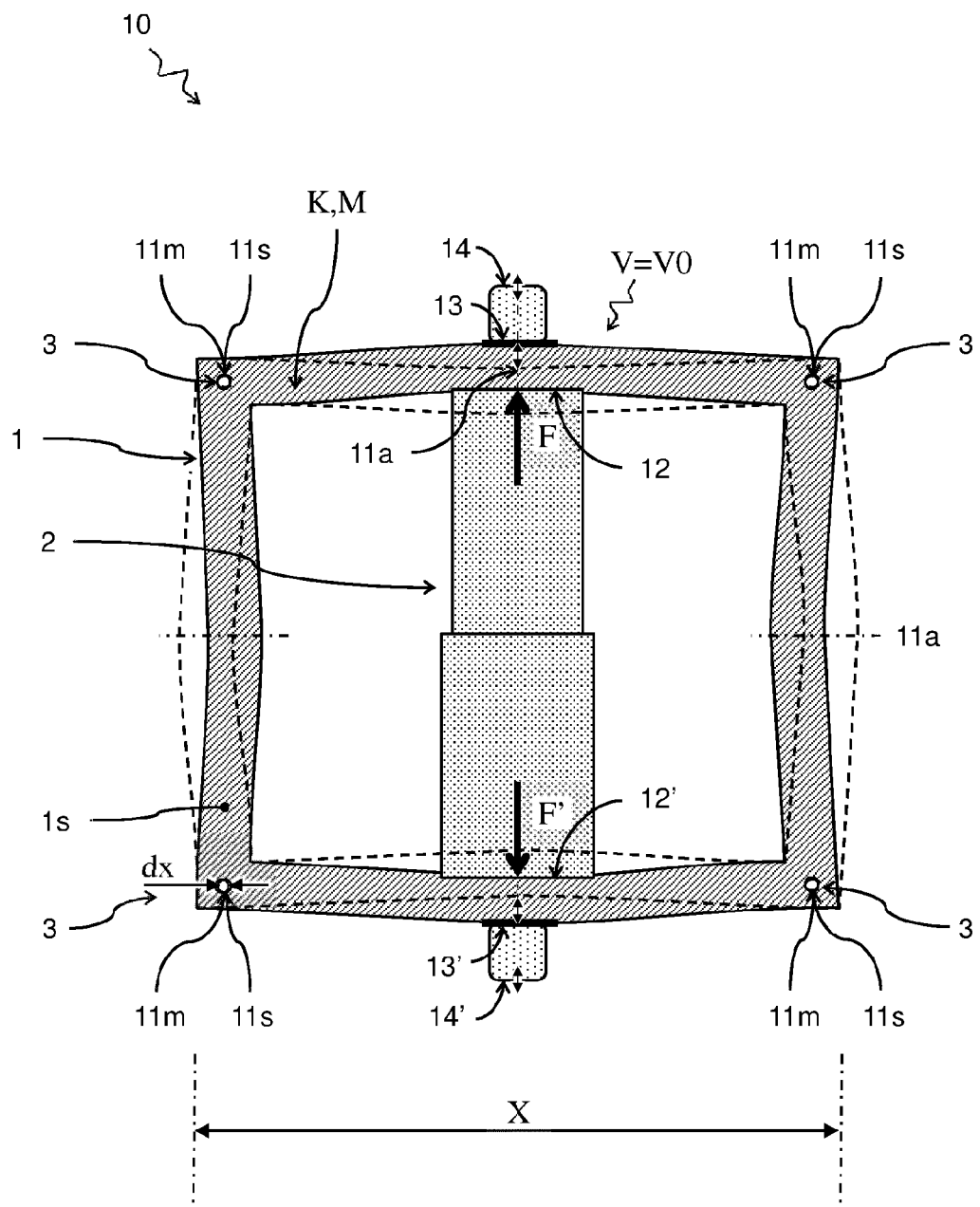
FIG. 1 shows a schematic cross-section of an embodiment of an actuator module for actuating a load.

Unless otherwise defined, all terms (including technical and scientific terms) used herein have the same meaning as commonly understood by one of ordinary skill in the art to which this invention belongs as read in the context of the description and drawings. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some instances, detailed descriptions of well-known devices and methods may be omitted so as not to obscure the description of the present systems and methods. Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The description of the exemplary embodiments is intended to be read in connection with the accompanying drawings, which are to be considered part of the entire written description. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

FIG. 1 shows a schematic cross-section of an embodiment of an actuator module 10 for actuating a payload 14, e.g. load, body or object to be actuated.

The actuator module 10 comprises a deformable frame 1. The deformable frame 1 has a stiffness distribution K and mass distribution M. The stiffness distribution K and mass distribution M determine vibrational eigenmodes V of the deformable frame 1. An interface or surface is of the deformable frame 1 comprises a plurality of mode nodal points 11m. The mode nodal points 11m are points that are stationary during modal deformation of the deformable frame 1. Modal deformation is deformation that occurs when a particular eigenmode V of deformable frame 1 is excited, e.g. in an excited state V0.

The actuator module 10 comprises an actuator 2 connected to the deformable frame 1. The actuator 2 is arranged for exerting a time-varying force distribution F onto the deformable frame 1, e.g., a time-oscillating force distribution wherein a magnitude of the force distribution periodically varies as a function of time, typically in a sinusoidal fashion. The force distribution F is exerted via a connection 12 between the deformable frame 1 and the actuator 2. The connection 12 is e.g. determined by the extent over which the actuator 2 and deformable frame 1 are connected. The interface 1s of the deformable frame 1 comprises a plurality of static nodal points 11s. Static deformation is deformation that occurs when the force distribution exerted by the actuator is applied under quasi-static conditions, i.e. under conditions where the time-variation of the force distribution is applied at frequencies well below the lowest eigenfrequency of the frame. The static nodal points 11s are points which are stationary during static deformation of the deformable frame 1 when the force distribution F, normally exerted by the actuator 2 under time-varying conditions, is applied under quasi-static conditions.

The deformable frame 1 comprises an actuation surface 13. The actuation surface 13 can be used for actuating a load 14 contacting and/or connected to said actuation surface 13. In use, the actuation surface 13 oscillates due to the static deformations of the deformable frame 1 caused by the actuator 2 as well as any modal deformations caused by coupling of the time-varying force distribution F to the respective eigenmode V. Advantageously, the force distribution F, stiffness distribution K, and/or mass distribution M are adapted such that the static nodal points 11s are as close as possible to the mode nodal points 11m, preferably coinciding. In this way, the relative contributions of the static and modal deformations may have a lower influence on a position of the effective nodal, i.e. stationary points. It is noted that in a three dimensional structure such as the deformable frame, typically a nodal line can be identified traversing the frame. The nodal points may be considered as positions where the nodal line comes to the surface of the deformable frame, i.e. intersects with that interface or surface of the deformable frame, typically on two sides of the deformable frame.

In one embodiment, the force distribution F is adapted such that one eigenmode is predominantly excited over a frequency range for which the actuator module 10 is set to operate. In other words, energy of the actuator 2 is preferably transferred predominantly into one eigenmode in the operating range. For example, more than 50% of the energy goes into the dominant eigenmode, preferably more than 80%, even more preferably more than 90%, or even all the energy. Alternatively or in addition, in one embodiment, the actuating force distribution predominantly couples to a plurality eigenmodes, wherein each of said plurality of eigenmodes comprises a respective plurality of mode nodal points, wherein mode nodal points of different modes are set to coincide as close as possible with each other and/or with the respective static nodal points, e.g. within a distance of less than one percent of a size "X" of the frame (e.g. width of the surface is where the connectors 3 are to be attached).

In one embodiment, the deformable frame 1 comprises a plurality of frame connectors 3 for connecting the actuator module to a base frame 20. In one embodiment, the frame connectors 3 are arranged at the interface 1s of the deformable frame 1 centred on the coinciding nodal points 11m,11s. While it is considered advantageous to arrange the frame connectors centred at the coinciding nodal points, most preferably at least centred at the static nodal points, alternatively it may be sufficient to position the frame connectors close to the coinciding nodal points or at least close to the static nodal points for obtaining a desired effect of sufficiently low vibrational transfer, e.g. placing the frame connectors near the coinciding nodal points, e.g. within a distance of five, two, one, half or one-tenth a percent of a size (e.g. height and/or width) of the frame surface or interface 1s. In one embodiment, each frame connector 3 comprises a respective recess and/or protrusion centred on the coinciding nodal points 11m,11s for holding the deformable frame 1 via the recess and/or protrusion. In one embodiment, the deformable frame 1 comprises three connectors 3 at each of two sides 1a, 1b of the deformable frame 1.

In one embodiment, the connection 12 between the actuator 2 and deformable frame 1 is centred on an mode anti-node 11a of the deformable frame 1. The anti-node is a position on a surface of the deformable frame 1 where the modal deformation of the deformable frame 1 is maximal in the excited state V0 of the eigenmode V. Typically, this will be between two nodes.

In one embodiment, the deformable frame 1 comprises a closed loop surrounding the actuator 2 wherein the actuator 2 exerts opposite forces F,F' on either side 12,12' of the loop. In another or further embodiment, the deformable frame 1 comprises a mirror symmetric structure wherein an equal but opposite force distribution F is applied on either side 12, 12' of the mirror symmetric structure by one or more actuators 2 therein between. Such force distributions F may result in an equal but opposite deformation of the mirror symmetric structure.

In one embodiment, the actuator module 10 is used in an atomic force microscope (AFM). Typically, an AFM comprises a cantilever with a sharp tip (probe) at its end that is used to scan the specimen surface. The cantilever is typically silicon or silicon nitride with a tip radius of curvature on the order of nanometers. When the tip is brought into proximity of a sample surface, forces between the tip and the sample lead to a deflection of the cantilever. In one embodiment, the actuator module 10 is comprised in an AFM, wherein the load 14 comprises an AFM tip holder connected to the deformable frame 1 at the actuation surface 13. In use, e.g. tapping mode, the cantilever is driven to oscillate up and down near its resonance frequency by the actuation surface 13. The amplitude of this oscillation is typically between 10-1000 nm, preferably between 50-500 nm, more preferably between 100-200 nm. The interaction of forces acting on the cantilever when the tip comes close to the surface may influence the amplitude of this oscillation e.g. decrease as the tip gets closer to the sample. Typically, deflection of the cantilever is measured using a laser reflected from the top surface of the cantilever, e.g. into an array of photodiodes. Other methods may include optical interferometry, capacitive sensing or piezoresistive AFM cantilevers. By measurement of the behaviour of the cantilever, an image can be reconstructed of a sample surface beneath the AFM tip. The actuator module 10 may also find application in other systems that need accurately controlled actuation.

In one embodiment, the actuator module 10 comprises or couples to a dummy load 14' actuated by a second actuating surface 13'. In this way symmetry of the system can be further improved.

Figure 2A:
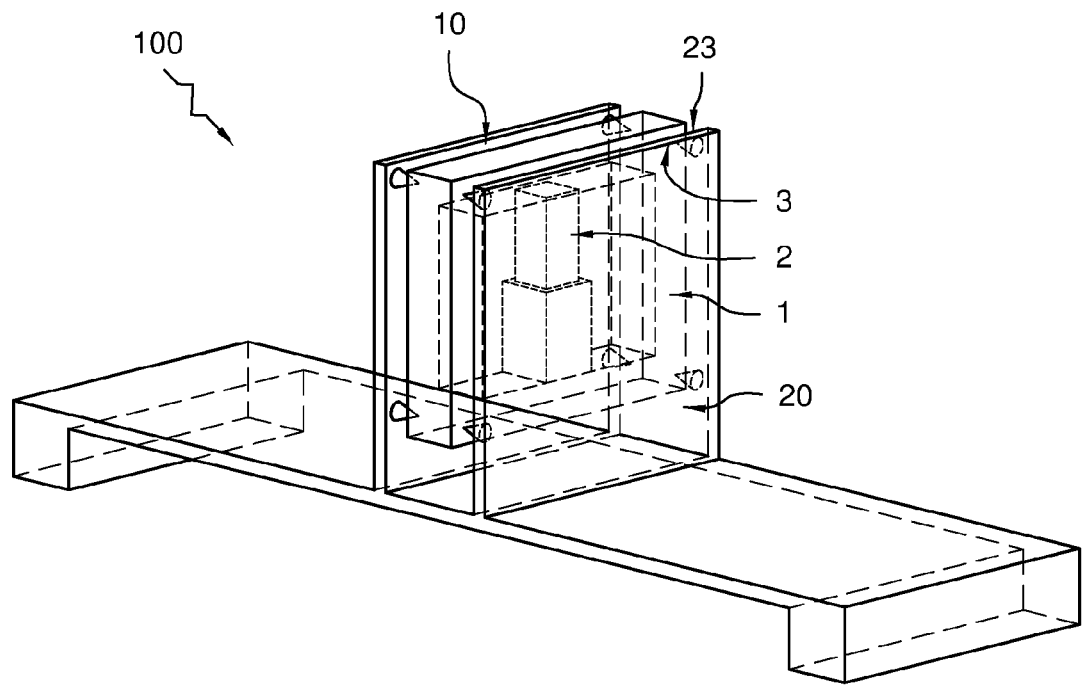
FIG. 2A shows a schematic perspective view of an embodiment of an actuator system comprising an actuator module similar to that shown in FIG. 1.
Figure 2B:
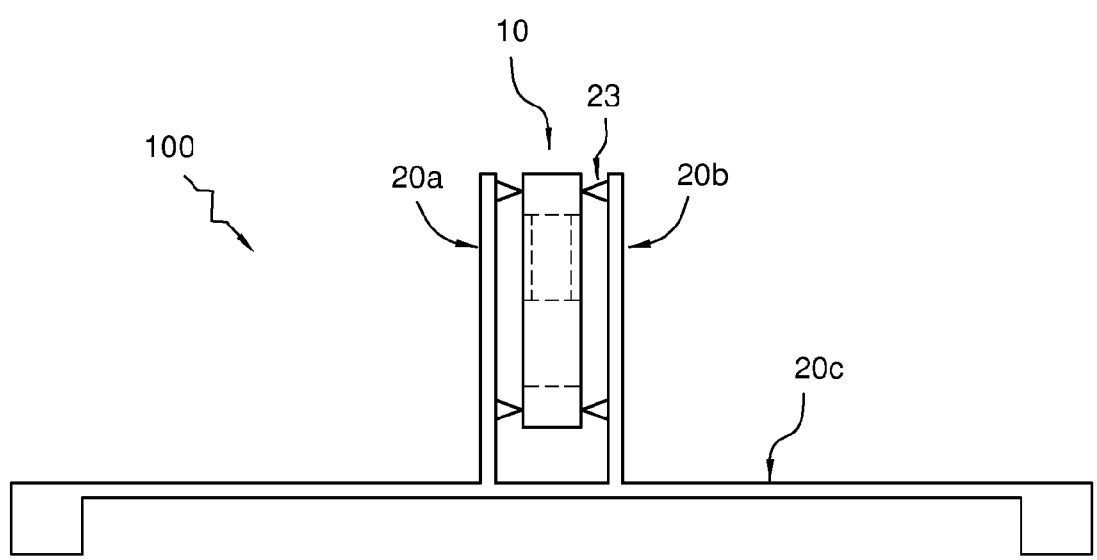
FIG. 2B shows a side view of the embodiment of FIG. 2A.

FIG. 2A shows a schematic perspective view of an embodiment of an actuator system 100. FIG. 2B shows a side view of the embodiment.

In one embodiment, the actuator system 100 comprises a base frame 20 holding an actuator module 10 as described herein. In one embodiment, the actuator module 10 is suspended by the base frame 20. In one embodiment, the actuator module 10 is connected to the base frame 20 via a plurality of pins 23 engaging respective frame connectors 3 on the interface 1s of the deformable frame 1. In the embodiment shown, the pins are cone shape with their tips directed towards the actuator module 10. Also other connectors are possible, e.g. as discussed below with reference to FIGS. 9A and 9B. Preferably, the pins 23 have a sharp tip to minimize a contact area with the actuator module 10, in particular the interface 1s of the deformable frame 1. Preferably, the contact area is smaller than 1 mm$^2$, preferably smaller than 0.1 mm$^2$, or even smaller, e.g. around 0.01 mm$^2$. The smaller the contact area, the better the nodal points may be addressed.

In one embodiment, the deformable frame 1 comprises two or more frame connectors 3 at each of two sides of the deformable frame 1. Each set of frame connectors 3 is engaged by corresponding connectors 23 arranged on the base frame 20. In one embodiment, the actuator module 10 is held between two base plates 20a, 20b. The base plates 20a, 20b may themselves be connected to further structures making up the base frame 20. For example, in the shown embodiment, the base plates 20a, 20b are connected to a bottom plate 20c.

Figure 3A:
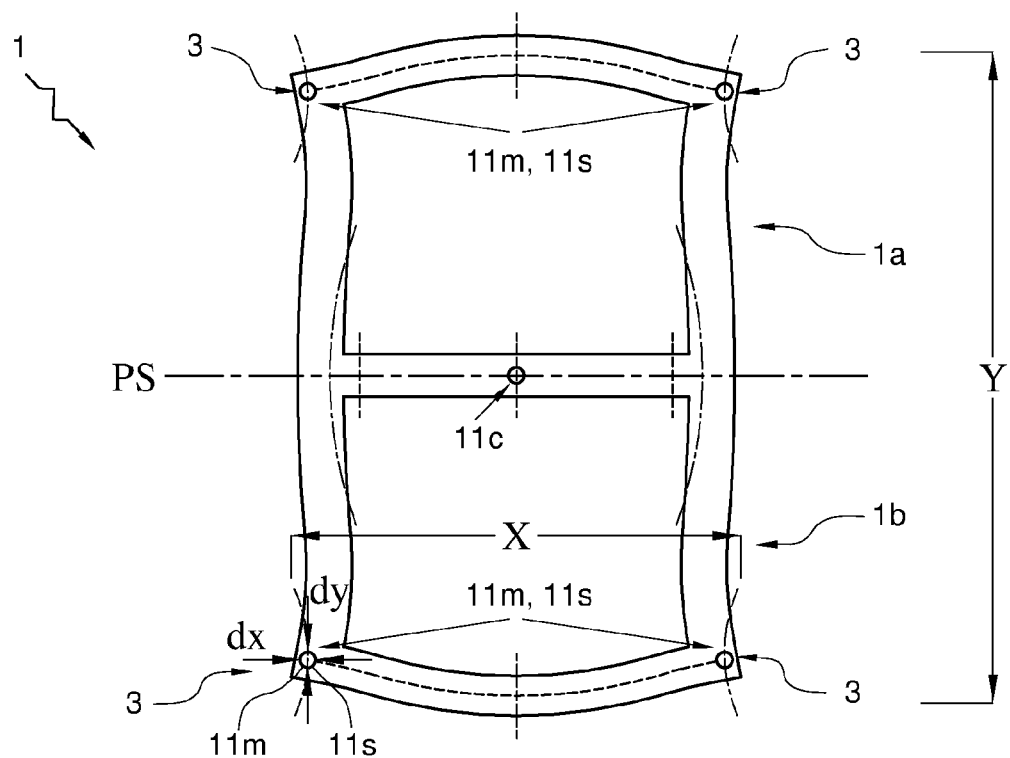
FIG. 3A shows a schematic cross-section view of another embodiment of a deformable frame.

FIG. 3A shows a schematic cross-section view of an embodiment of a deformable frame 1. Preferably, the force distribution, stiffness distribution, and mass distribution are adapted to have the static nodal points 11s coincide with the mode nodal points 11m. Preferably, the static nodal points 11s coincide with the mode nodal points 11m within a distance dx or dy of less than one percent of a size X or Y across the interface 1s of the deformable frame 1. For example in the present embodiment, the height or length Y of the frame 1 is more than the width X. For example, the preferred maximum relative distance between the nodal points may be expressed as a percentage of the largest dimension of the frame, in this case Y. The preferred maximum tolerance across each dimension can also be expressed relative to maximum size of the frame surface is in that dimension, e.g. less than one percent of that size X or Y, respectively. For example, in the present embodiment, the tolerance "dy" may be twice as large as the tolerance "dx" due to the length "Y" of the frame 1 being twice as much as the width "X". Of course this should be considered a rule of thumb and it is still more preferable to have the distance between the respective static nodal points and mode nodal points as small as possible. The frame connectors 3 are preferably located at one or more of the nodal points 11m and/or 11s, most preferably at or near at least the static nodal points 11s. The reference 11c indicates a centre of mass of the frame. It will be appreciated that if the frame vibrates symmetrically, the centre of mass can remain stationary and also act as a nodal point.

Figure 3B:
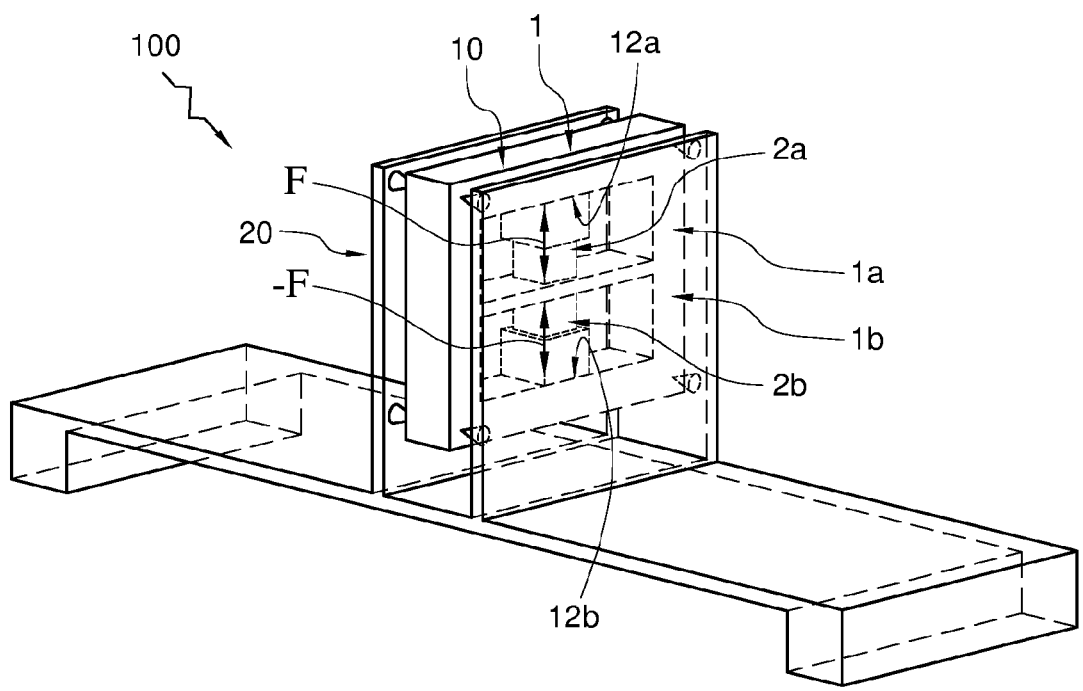
FIG. 3B shows a schematic perspective view of an embodiment of an actuator system comprising the deformable frame of FIG. 3A.

FIG. 3B shows a schematic perspective view of an embodiment of an actuator system 100 comprising the deformable frame 1. In one embodiment, the deformable frame 1 comprises two interconnected closed loops 1a, 1b. In one embodiment, each loop surrounding a respective actuator 2a,2b. In another or further embodiment, the actuator module 10 comprises at least two actuators 2a,2b working in opposite directions for applying equal but opposite force distributions F,−F on different sides 12a, 12b of the deformable frame 1. Preferably, the deformable frame 1 is symmetric, e.g. comprises a plane of symmetry PS.

Figure 4A:
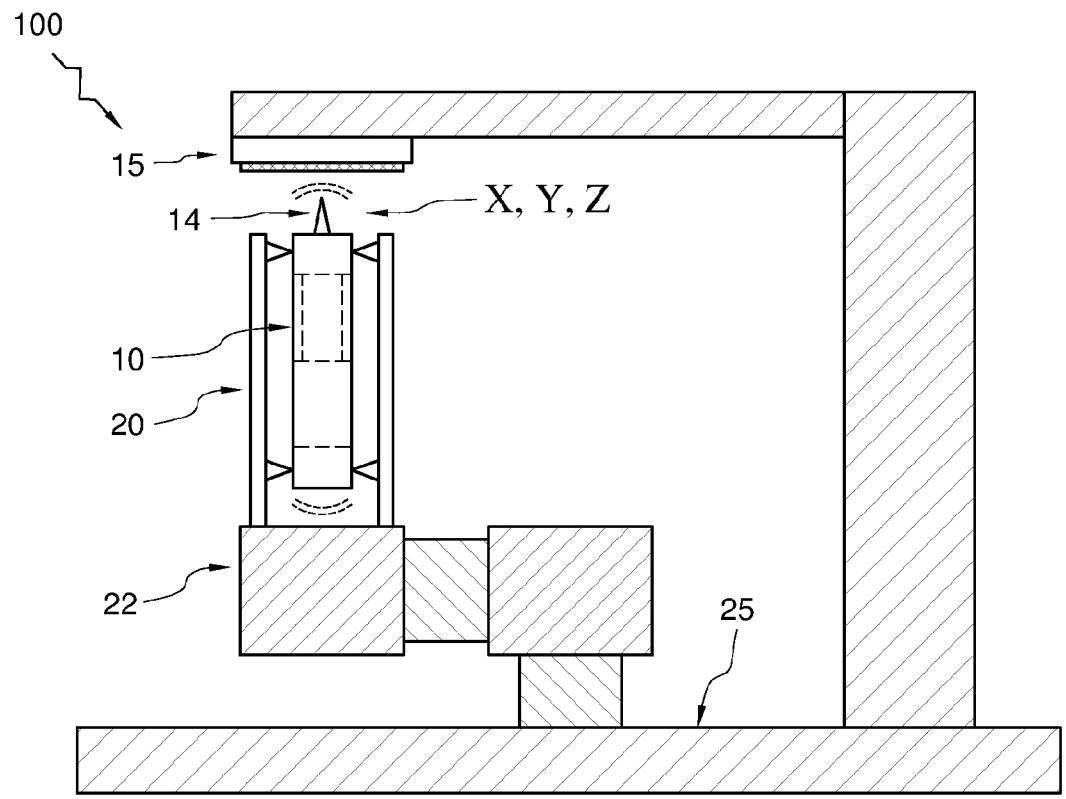
FIG. 4A shows a schematic side view of another embodiment of an actuator system.

FIG. 4A shows a schematic side view of an actuator system 100. The actuator system 100 comprises a base frame 20 holding an actuator module 10 as described herein. In one embodiment, the actuator system 100 comprises a translation and/or rotation system 22 between the base frame 20 and a stationary base 25. This can allow controlled translation and/or rotation of the base frame 20 with respect to the stationary base 25.

In one embodiment, the deformable frame of the actuator module 10 acts like a scan head that is scanned e.g. over a surface. In one embodiment, an atomic force microscopy system comprises an actuator module 10 and/or actuator system 100 as described herein. In one embodiment, the actuation surface 13 is arranged for actuating a probe tip 14 for scanning the surface of a specimen 15. In one embodiment, the system comprises a controller (not shown) that controls the translation and/or rotation system 22, e.g. for moving the actuation surface and/or load 14.

Figure 4B:
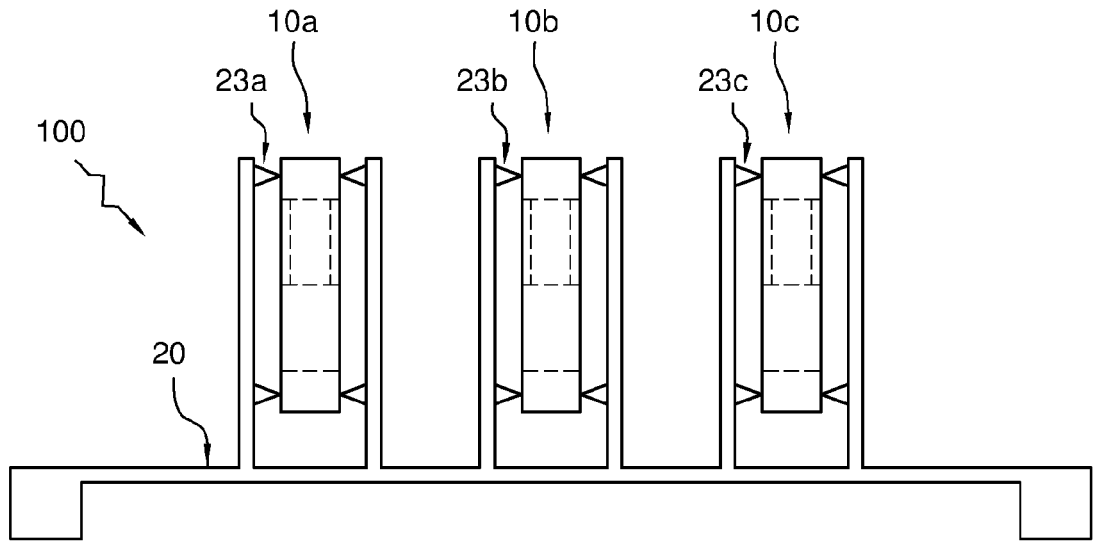
FIG. 4B shows a schematic side view of yet another embodiment of an actuator system.

FIG. 4B shows a schematic side view of another actuator system 100. In the embodiment, the base frame 20 is connected a plurality of actuator modules 10a,10b,10c. Each actuator module may be connected to the base frame 20 via by its own set of connectors 23a,23b,23c.

Figure 5A:
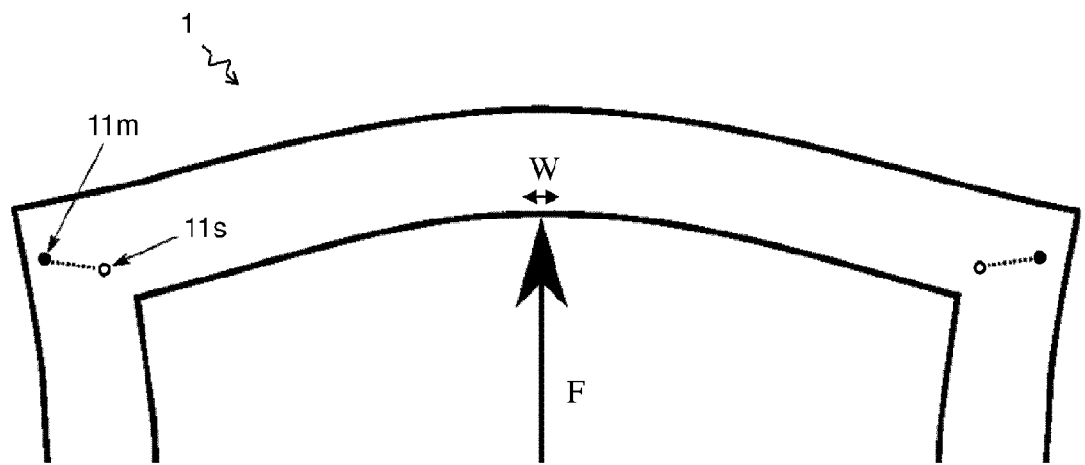
FIG. 5A-C show an illustration of an embodiment where positions of the nodal points are varied.
Figure 5B:
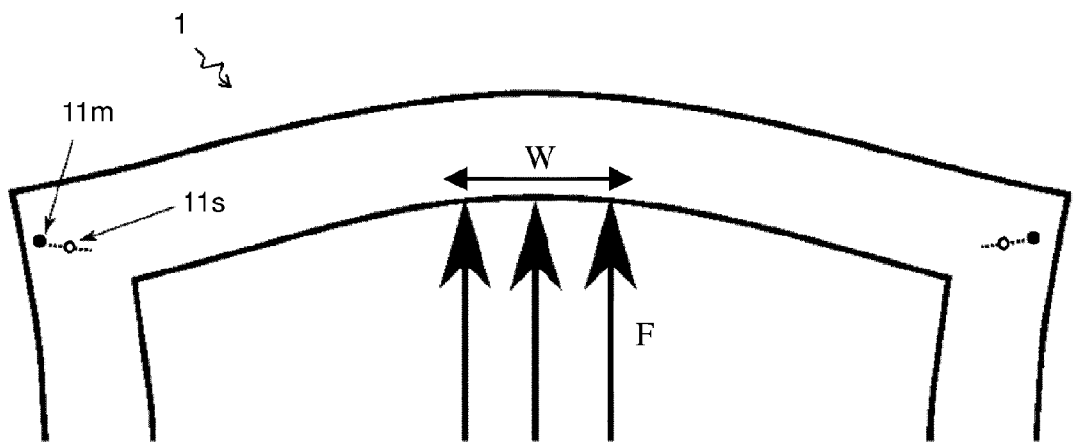
Figure 5C:
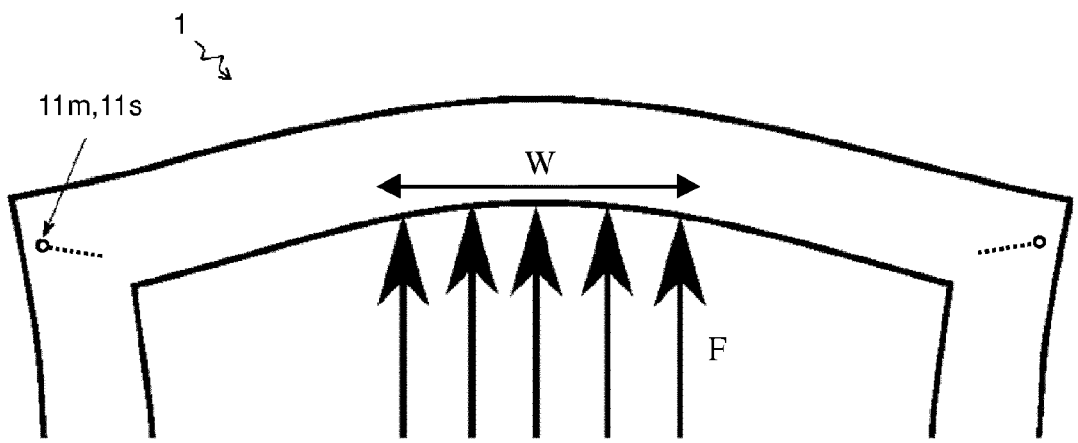

FIG. 5A-C show an illustration of an embodiment where a position of the static and mode nodal points 11s,11m are overlaid. As shown, the mode nodal point 11m is considered independent from the actuator force F, while the static nodal points 11s can shift depending on the force distribution F over a width W. It may be noted that by applying the force over a larger width W, the static nodal points 11s can be moved outward.

In one embodiment, a width of the force distribution F is determined at least partly by a connection between one or more actuators and the deformable frame 1. In one embodiment, an actuator comprises an actuating surface whose width is adjusted to apply the force distribution F over a specific width W to the deformable frame 1. Alternatively or in addition, in one embodiment, the actuator module comprises a plurality of actuators arranged side by side, each applying a respective force onto the deformable frame 1, wherein the plurality of actuators cooperate to apply the force distribution F over a specific width W. The actuators can be arranged along a dimension of the width W as indicated. Alternatively or in addition, actuators can be arranged in a depth dimension of the frame.

Figure 6A:
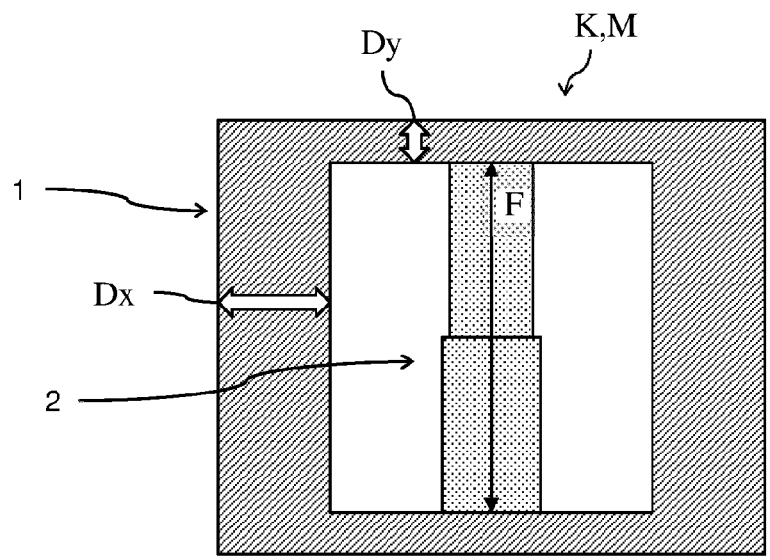
FIG. 6A shows another embodiment of a deformable frame 1.

FIG. 6A shows an embodiment of a deformable frame 1 wherein the width Dy of part of the frame that is in contact with the actuator 2 is less than a width Dx of part of the frame parallel to the actuation direction. Changing a width of the frame can influence both the mass distribution M and stiffness distribution K.

Figure 6B:
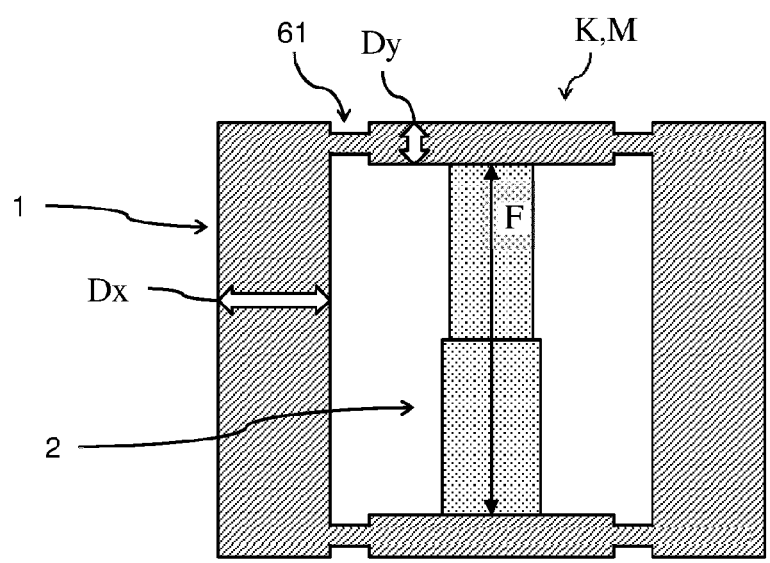
FIG. 6B shows yet another embodiment of a deformable frame 1.

FIG. 6B shows another embodiment of a deformable frame 1 with similar widths Dx,Dy. However, in this embodiment, the deformable frame 1 comprises a recess local which may lower the stiffness distribution K at that location. It will be appreciated that by variation of the shape a desired combination of stiffness and mass distributions may be obtained to influence a normal mode and frequency of the deformable frame 1.

In one embodiment, the deformable frame 1 has a lower stiffness in a direction wherein the actuator 2 actuates the deformable frame 1 than in a direction perpendicular thereto. This can have an advantage that the parts of the deformable frame 1 remain more stationary, in particular, the thicker parts Dy may be less flexible than the thinner parts Dy.

It is noted that the stiffness or the rigidity of a structure is the extent to which it resists deformation in response to an applied force. Stiffness may be regarded as an extensive property of the structure, e.g. solid body, dependent on the material, shape, and boundary conditions. Behaviour of the constituent material itself can also be described by its elastic modulus. The stiffness can vary over the extent of the structure, e.g. some parts can be more flexible than others. While the stiffness may influence both the modal deformation and the static deformation, said influence is not necessarily the same. Accordingly, the relative position of mode nodal points and static nodal points can still be influenced by the stiffness distribution.

The stiffness distribution may be related to the mass distribution, though it is not necessarily the same. For example, in location of the structure where more mass is placed, the structure may typically also be more stiff. However, for example stiffness can be locally influenced by a particular shape of the structure while the mass is not changed. Also, e.g. mass can be lumped onto a structure without appreciably influencing the stiffness, e.g. by adding the mass to the deformable frame in a direction perpendicular to the actuator motion. The mass distribution typically influences the modal deformation and mode nodal points while the static deformation is relatively unaffected. Accordingly, the relative position of the mode nodal points and static nodal points can be influenced by redistribution of mass, which however may also influence the stiffness distribution as noted above.

It will be appreciated from the above that a relatively easy way to influence the relative position of the static nodal points with respect to the mode nodal points, is by variation of the force distribution, since this parameter can be tuned relatively independently. In general, the static and mode nodal points may better coincide, when the static deformation more closely matches the modal deformation.

Figure 7A:
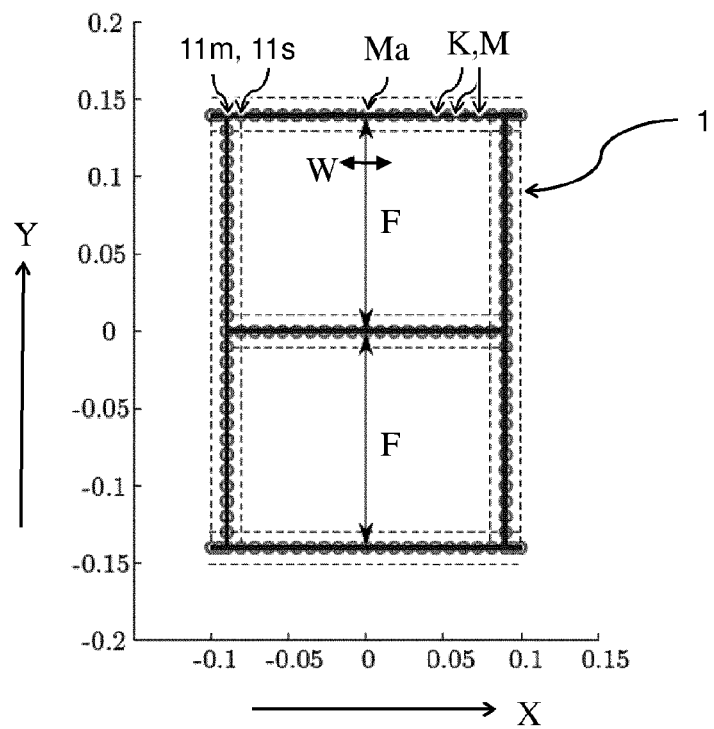
FIG. 7A shows a graph of a simulated deformable frame.

FIG. 7A shows a graph of a simulated deformable frame 1 in frontal view with coordinates (x,y). The circles indicate nodes used in the calculation of the beam element model, while the dashed lines indicate an extent of the frame beams. Simulated forces F are applied between the loops of the frame 1 over a width W as indicated.

Figure 7B:
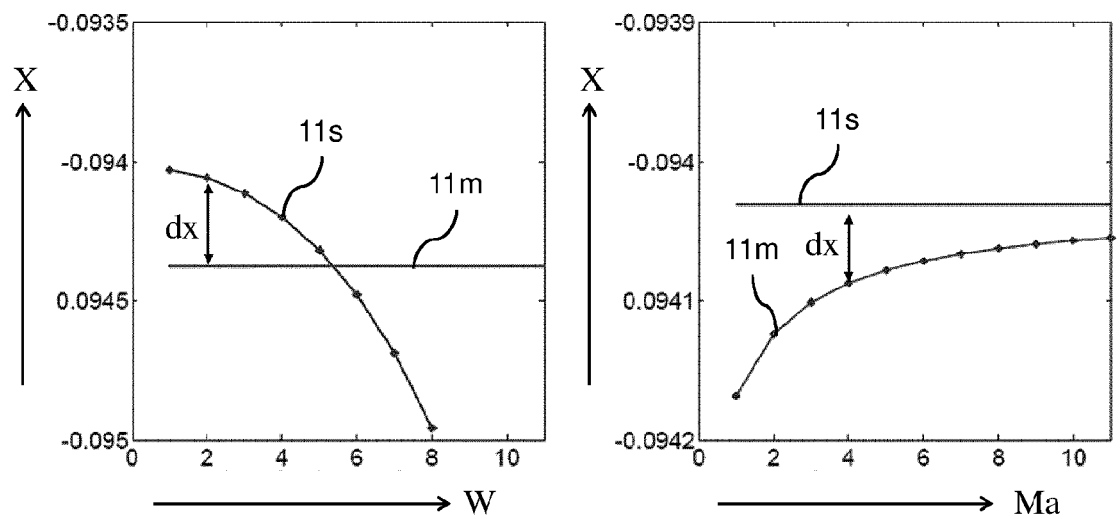
FIG. 7B shows calculations of relative positions of static nodal mode nodal point.

FIG. 7B shows calculations of the relative positions of the static nodal points 11s and mode nodal points 11m. The graph on the left hand side of FIG. 7B shows the positions x of nodal points as a function of the width W over which the force is distributed to the frame, as shown in FIG. 7A. As also explained with reference to FIGS. 5A-C, by increasing the width W, e.g. by increasing the contact area between the actuator and deformable frame 1, the static nodal point 11s can be moved while the mode nodal points 11m is unaffected. It will be appreciated that a distance dx between the static nodal point 11s and mode nodal point 11m can thus be decreased.

The graph on the right hand side of FIG. 7B shows the positions x of nodal points as a function of the mass Ma applied at the node of the applied force. By increasing the mass, the mode nodal point 11m can be shifted towards the static nodal points 11s thus decreasing the distance dx therein between.

Together the figures illustrate an embodiment of a computer-implemented method for designing an actuator module. The method comprises simulating a deformable frame 1 having a stiffness distribution K and mass distribution M. The method further comprises simulating exerting a force distribution F onto the deformable frame 1. The force is simulated under static or quasi-static conditions, e.g. a static deformation with the applied force is compared to a situation wherein no force or force of a different magnitude is applied. In another definition, quasi-static conditions may apply at a frequency well below any eigenfrequencies of the deformable frame, e.g. with a time-varying force having a frequency below 1 Hz. The method further comprises calculating positions of static nodal points 11s which are stationary during static deformation of the deformable frame 1 under said conditions. The method further comprises calculating vibrational eigenmodes of the deformable frame 1. In particular, an eigenmode is calculated or selected that couples to the force distribution F when a magnitude of the force distribution F is time-oscillated since this mode may affect the position of the stationary point. The method further comprises calculating positions of mode nodal points 11m at an interface 1s of the deformable frame 1 which are stationary during modal deformation of the deformable frame 1 in an excited state V0 of the said eigenmode V. The method further comprises calculating a distance dx between the static nodal points 11s and the mode nodal points 11m. The method further comprises varying one or more of the force distribution F, stiffness distribution K, and/or mass distribution M until the static nodal points 11s coincide with the mode nodal points 11m, e.g. are within a threshold distance.

In one embodiment, the method is stored on a computer-readable storage medium with program instructions that, when run on one or more computers, cause the one or more computers to perform the said method.

It will be appreciated that an actuator module as described herein can thus be manufactured according to design specification wherein the static nodal points 11s coincide with the mode nodal points 11m, e.g. as obtained by the method described herein. Furthermore, in one embodiment, the actuator module is manufactured by providing a deformable frame 1 with the stiffness distribution K and mass distribution M according to the design. Furthermore, one embodiment comprises providing an actuator 2 connected to the deformable frame 1 and arranged for exerting a time-varying force distribution F onto the deformable frame 1 via a connection 12 between the deformable frame 1 and the actuator 2, wherein the force distribution F at least under quasi-static conditions is arranged according to the design.

Figure 8:
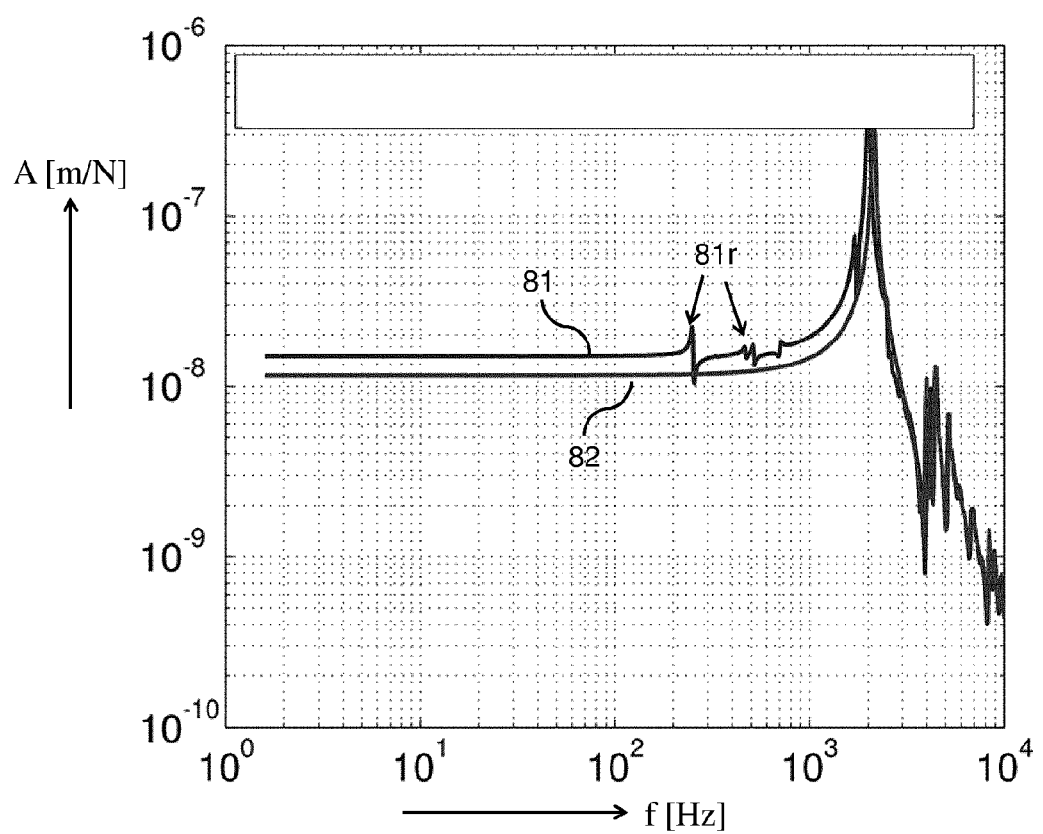
FIG. 8 shows graphs of frequency response functions.

FIG. 8 shows a graph of frequency transfer functions 81 and 82. The frequency transfer functions 81 corresponds to a conventional connection between a actuator module and base frame. It may be observed that transfer functions 81 comprises a number of resonances, 81r caused by resonances in the base frame. On the other hand, the frequency transfer functions 82 corresponds to a actuator module optimized according to the present disclosure. It will be appreciated that the transfer function is more smooth and does not suffer from the resonances 81r. Accordingly, its behaviour can be more predictable so it can be more easily modelled and/or calibrated.

Figure 9A:
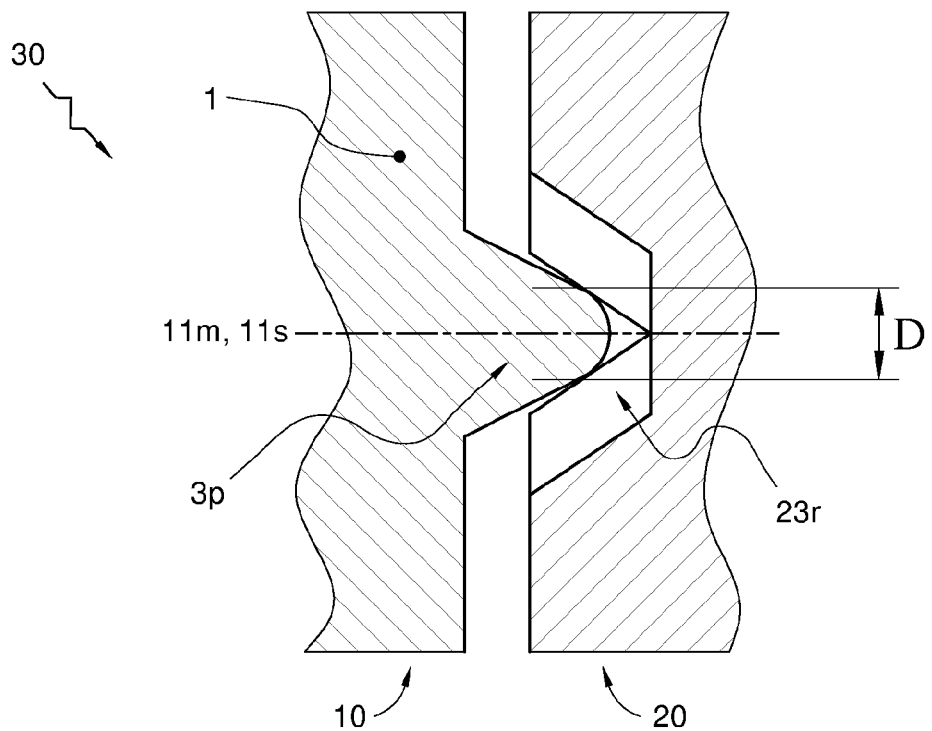
FIG. 9A shows a schematic cross-section view of one embodiment of a connection between the actuator module and base frame.

FIG. 9A shows a schematic cross-section view of one embodiment of a connection 30 between the actuator module 10 and base frame 20. In the embodiment, the deformable frame 1 of the actuator module 10 comprises a protrusion 3p centred on the coinciding nodal point or line 11m,11s. The base frame 20 comprises a corresponding recess 23r that engages the protrusion 3p to hold the actuator module 10.

Figure 9B:
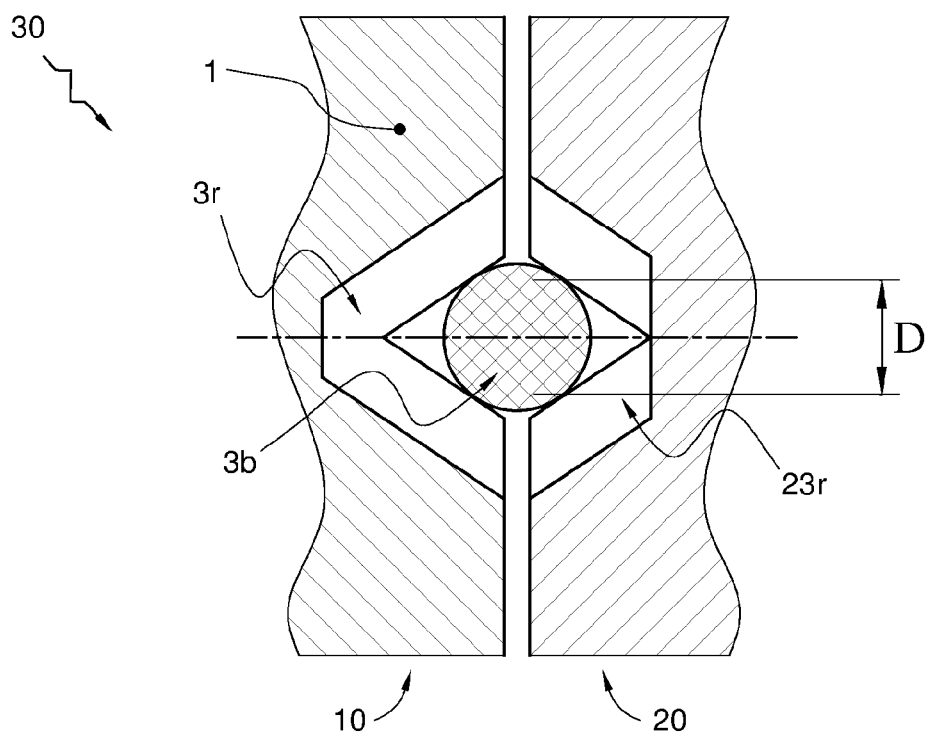
FIG. 9B shows a schematic cross-section view of another embodiment of a connection between the actuator module and base frame.

FIG. 9B shows a schematic cross-section view of another embodiment of a connection 30 between the actuator module 10 and base frame 20. In the embodiment, the deformable frame 1 of the actuator module 10 comprises a recess 3r centred on the coinciding nodal point or line 11m,11s. The base frame 20 also comprises recess 23r. The two recesses 3r and 23r may engage each other via a ball 3b to hold the actuator module 10.

It is noted that, in practice a real point contact between the deformable frame 1 and base frame 20 can be difficult to achieve. To approximate a point contact, it is preferred to provide a (circular) contact with a centre corresponding to the intended suspension point. While the frame motion around the centre need not be zero, it may at least partly cancel out. Furthermore, when friction between the two surfaces is minimized, the transferred motion to the base frame can be minimized. This may further prevent that vibrations of the base frame are excited.

Furthermore, while the nodal points 11m,11s are chosen to be stationary at least with respect to lateral translation, the modal and/or static deformation may still cause a (small) twisting of the frame around the nodal points. Accordingly, in a preferred embodiment, the connection 30 between the actuator module 10 and base frame 20 allows rotation around the respective coinciding nodal point 11m,11s. This may prevent that rotational vibrations are passed via the connection 30 between the actuator module 10 and base frame 20.

In one embodiment, the connection 30 between the actuator module 10 and base frame 20 comprises an anti-frictional layer, e.g. teflon or a ceramic top layer. In one embodiment the connection 30 comprises a steel ball. Advantageously when one or more of the groove, recess, and/or ball comprise a relatively hard material, a contact surface can be reduced. In one embodiment, the connection 30 comprises a groove shaped recess on a side of the base frame 20. Advantageously, e.g. a protrusion on a side of the deformable frame 1 may still translate in the direction of the groove; this way internal stresses can be avoided. Accordingly, in one embodiment, the connection 30 between the actuator module 10 and base frame 20 is arranged to allow translation in a direction of the connection 30, i.e. transverse to the surface 1 in a direction of the dashed nodal line. This may prevent that vibrations transverse to the actuating direction of the actuator (not shown here) are passed via the connection 30 between the actuator module 10 and base frame 20.

In the embodiments the axis of rotation is centred around the stationary point and the friction along this rotation is minimized. This may thus closely mimic suspension on a perfect point. Still, the dimensions are preferably chosen as small as possible. Preferably, the diameter "D" of the engaging area between the deformable frame 1 and base frame 20 is smaller than 1 mm, or even smaller than 0.1 mm.

Figure 10A:
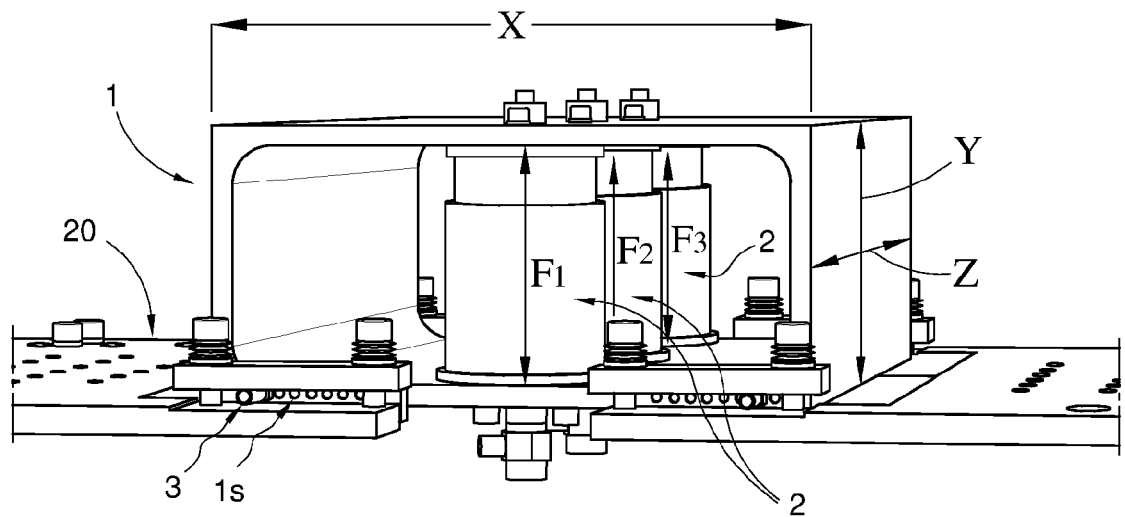
FIG. 10A shows another embodiment an actuator system comprising a base frame holding an actuator module.

FIG. 10A shows another embodiment an actuator system 100 comprising a base frame 20 holding an actuator module 10 according to any of the previous claims, wherein the actuator module 10 is connected to the base frame 20 by engaging respective frame connectors 3 on the interface 1s of the deformable frame 1. In the embodiment, the force distribution is variable along a dimension Z of the frame 1 that is transverse to dimensions X,Y of the interface 1s where the frame connectors 3 engage. For example, multiple actuators 2 are placed along the depth dimension of the frame Z to provide a respective force F1,F2,F3. For example, three voice coil actuators are located along the depth of the deformable frame, and the force distribution over these voice coils is used to control the static deformation. In one embodiment, the force distribution F1,F2,F3 is adapted along a dimension transverse to the interface 1s to have the static nodal points coincide with the mode nodal points (not shown).

Figure 10B:
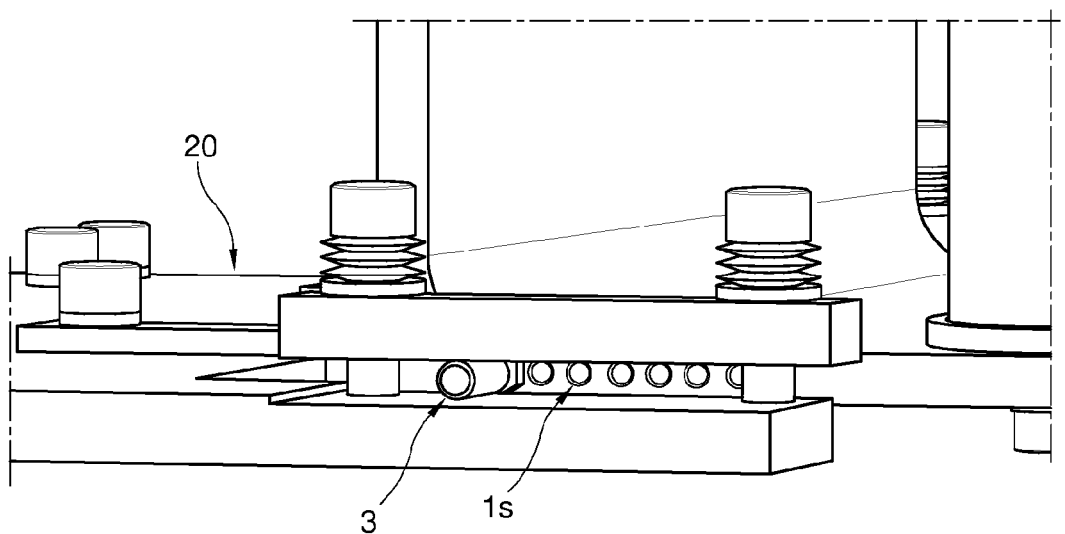
FIG. 10B shows a zoomed-in view of an embodiment for attaching the base frame to the actuator module.

FIG. 10B shows a zoomed-in view of an embodiment for attaching the base frame 20 to the actuator module 10. In the embodiment, a small pin 3 is screwed inside the deformable frame 1 at the location of the nodal point and then clamped at the side of the base frame. In the embodiment, the interface 1s of the actuator module comprises multiple recesses to test the effect of placement of the pin 3 at different positions and to find the optimum e.g. at or near the nodal points.

For the purpose of clarity and a concise description, features are described herein as part of the same or separate embodiments, however, it will be appreciated that the scope of the invention may include embodiments having combinations of all or some of the features described. For example, while embodiments were shown for actuator modules with particular frame shapes, also alternative frames may be envisaged by those skilled in the art having the benefit of the present disclosure for achieving a similar function and result. E.g. mechanical and/or electrical components may be combined or split up into one or more alternative components. The various elements of the embodiments as discussed and shown offer certain advantages, such as minimizing vibrational transfer to a support frame. Of course, it is to be appreciated that any one of the above embodiments or processes may be combined with one or more other embodiments or processes to provide even further improvements in finding and matching designs and advantages. It is appreciated that this disclosure offers particular advantages to atomic force microscopy, and in general can be applied for any application wherein an actuator is desired having an improved frequency transfer function with less influence of the supporting base frame.

While the present systems and methods have been described in particular detail with reference to specific exemplary embodiments thereof, it should also be appreciated that numerous modifications and alternative embodiments may be devised by those having ordinary skill in the art without departing from the scope of the present disclosure. For example, embodiments wherein devices or systems are disclosed to be arranged and/or constructed for performing a specified method or function inherently disclose the method or function as such and/or in combination with other disclosed embodiments of methods or systems. Furthermore, embodiments of methods are considered to inherently disclose their implementation in respective hardware, where possible, in combination with other disclosed embodiments of methods or systems. Furthermore, methods that can be embodied as program instructions, e.g. on a non-transient computer-readable storage medium, are considered inherently disclosed as such embodiment.

Finally, the above-discussion is intended to be merely illustrative of the present systems and/or methods and should not be construed as limiting the appended claims to any particular embodiment or group of embodiments. The specification and drawings are accordingly to be regarded in an illustrative manner and are not intended to limit the scope of the appended claims. In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage. In particular, all working combinations of the claims are considered inherently disclosed.

The invention claimed is:

1. An actuator system comprising an actuator module for actuating a load, the actuator module comprising
a deformable frame having a stiffness distribution and mass distribution determining a vibrational eigenmode of the deformable frame, wherein an interface formed by a surface of the deformable frame comprises a plurality of mode nodal points which are stationary during modal deformation of the deformable frame in an excited state of the eigenmode; and an actuator connected to the deformable frame and arranged for exerting a time-varying force distribution onto the deformable frame via a connection between the deformable frame and the actuator, wherein the interface of the deformable frame comprises a plurality of static nodal points which are stationary during static deformation of the deformable frame when the time-varying force distribution exerted by the actuator is applied under quasi-static conditions;

wherein the time-varying force distribution is arranged to couple to the excited state of the eigenmode and the deformable frame comprises an actuation surface, in use, oscillating due to the combined modal and static deformations of the deformable frame for actuating the load contacting and/or connected to said actuation surface; and wherein the force distribution, stiffness distribution, and/or mass distribution are adapted to have the static nodal points coincide with the mode nodal points within a tolerance distance of less than one percent of a size across the interface of the deformable frame.

2. The actuator system according to claim 1, wherein the deformable frame comprises a plurality of frame connectors for connecting the actuator module to a base frame wherein the frame connectors are arranged at the interface of the deformable frame-centred on the static nodal points and/or mode nodal points.

3. The actuator system according to claim 2, wherein each frame connector comprises a respective recess and/or protrusion centred on the static nodal points and/or mode nodal points for holding the deformable frame via the recess and/or protrusion.

4. The actuator system according to claim 2, wherein the frame connectors are rotation symmetric around the static nodal points and/or mode nodal points.

5. The actuator system according to claim 1, wherein the connection between the actuator and deformable frame is centred on a mode anti-node of the deformable frame which is a position on a surface of the deformable frame where the modal deformation of the deformable frame is maximal in the excited state of the eigenmode M.

6. The actuator system according to claim 1, wherein the deformable frame comprises a mirror symmetric structure wherein an equal but opposite force distribution is applied on either side of the mirror symmetric structure by one or more actuators therein between, the force distributions resulting in an equal but opposite deformation of the mirror symmetric structure.

7. The actuator system according to claim 1, comprising at least two actuators working in opposite directions for applying equal but opposite force distributions on different sides of the deformable frame.

8. The actuator system according to claim 1, further comprising a base frame holding the actuator module, wherein the actuator module is connected to the base frame by engaging respective frame connectors on the interface of the deformable frame.

9. The actuator system according to claim 8, wherein a connection between the actuator module and base frame is rotationally free around a respective static nodal point and/or mode nodal point.

10. The actuator system according to claim 8, comprising a translation and/or rotation system between the base frame and a stationary base for controlled translation and/or rotation of the base frame with respect to the stationary base.

11. The actuator system according to claim 8, wherein the base frame is connected a plurality of actuator modules.

12. The actuator system according to claim 8, wherein the actuation surface is arranged for actuating a probe tip for scanning a specimen surface in an atomic force microscope.

13. A computer-implemented method for designing an actuator module, the method comprising simulating a deformable frame having a stiffness distribution and mass distribution;

simulating exerting a force distribution onto the deformable frame under quasi-static conditions;

calculating positions of static nodal points which are stationary during static deformation of the deformable frame under quasi-static conditions;

calculating a vibrational eigenmode of the deformable frame that couples to the force distribution when a magnitude of the force distribution is time-oscillated;

calculating positions of mode nodal points at an interface formed by a surface of the deformable frame which are stationary during modal deformation of the deformable frame-in an excited state of the eigenmode;

calculating a distance between the static nodal points and the mode nodal points and varying one or more of the force distribution, stiffness distribution, and/or mass distribution until the static nodal points coincide with the mode nodal points within a tolerance distance of less than one percent of a size across the interface of the deformable frame.

14. A method for manufacturing an actuator module comprising designing an actuator module, by simulating a deformable frame having a stiffness distribution and mass distribution; simulating exerting a force distribution onto the deformable frame under quasi-static conditions;

calculating positions of static nodal points which are stationary during static deformation of the deformable frame under quasi-static conditions;

calculating a vibrational eigenmode of the deformable frame that couples to the force distribution when a magnitude of the force distribution is time-oscillated;

calculating positions of mode nodal points at an interface formed by a surface of the deformable frame which are stationary during modal deformation of the deformable frame in an excited state of the eigenmode; and calculating a distance between the static nodal points and the mode nodal points and varying one or more of the force distribution, stiffness distribution, and/or mass distribution until the static nodal points coincide with the mode nodal points within a tolerance distance of less than one percent of a size across the interface of the deformable frame;

providing a deformable frame with the stiffness distribution and mass distribution according to the design; and providing an actuator connected to the deformable frame and arranged for exerting a time-varying force distribution onto the deformable frame via a connection between the deformable frame and the actuator, wherein the force distribution at least under quasi-static conditions is arranged according to the design.

* * * * *